United States Patent [19]
Nakanishi et al.

[11] Patent Number: 5,748,658
[45] Date of Patent: May 5, 1998

[54] SEMICONDUCTOR LASER DEVICE AND OPTICAL PICKUP HEAD

[75] Inventors: Hideyuki Nakanishi, Kyoto; Akira Ueno, Katano; Hideo Nagai, Takatsuki; Akio Yoshikawa, Ibaraki, all of Japan

[73] Assignee: Matsushita Electric Industrial Co., Ltd., Osaka, Japan

[21] Appl. No.: 789,199

[22] Filed: Jan. 24, 1997

Related U.S. Application Data

[63] Continuation of Ser. No. 188,142, Jan. 27, 1994, abandoned.

[30] Foreign Application Priority Data

Oct. 22, 1993 [JP] Japan ................... 5-264575

[51] Int. Cl.⁶ .................................................. H01S 3/18
[52] U.S. Cl. .................... 372/43; 372/36; 372/50; 257/676; 257/680; 257/684; 257/690; 257/735; 257/707; 257/434; 257/81
[58] Field of Search ............................ 372/36, 34, 43, 372/50; 257/666, 668, 675, 676, 680, 684, 688, 690, 692, 734, 735, 670, 671, 706, 707, 431–434, 81, 99; 369/44.12

[56] References Cited

U.S. PATENT DOCUMENTS

| | | | |
|---|---|---|---|
| 4,589,010 | 5/1986 | Tateno et al. | 257/670 |
| 4,768,070 | 8/1988 | Takizawa et al. | 372/36 |
| 4,888,307 | 12/1989 | Spairisano et al. | 257/706 |
| 4,945,524 | 7/1990 | Igata | 372/36 |
| 5,082,339 | 1/1992 | Linnenbach | 385/14 |
| 5,089,861 | 2/1992 | Tanaka et al. | 372/36 |
| 5,140,572 | 8/1992 | Kibune et al. | 369/44.17 |
| 5,291,038 | 3/1994 | Hanamoto et al. | 257/81 |
| 5,293,038 | 3/1994 | Kadowaki et al. | 369/44.23 |
| 5,309,460 | 5/1994 | Fujimaki et al. | 257/99 |
| 5,327,443 | 7/1994 | Tanaka et al. | 372/36 |
| 5,361,244 | 11/1994 | Nakamura et al. | 369/44.12 |
| 5,367,530 | 11/1994 | Noishiki et al. | 372/43 |
| 5,446,719 | 8/1995 | Yoshida et al. | 369/44.12 |

FOREIGN PATENT DOCUMENTS

| | | | |
|---|---|---|---|
| 62-141794 | 6/1987 | Japan | 372/43 |
| 62-188385 | 8/1987 | Japan | 372/45 |
| 1256188 | 10/1989 | Japan . | |
| 2005495 | 1/1990 | Japan . | |
| 2-209785 | 8/1990 | Japan . | |
| 2-209786 | 8/1990 | Japan . | |
| 2209785 | 8/1990 | Japan . | |
| 3-34387 | 2/1991 | Japan . | |
| 3-142866 | 6/1991 | Japan | 257/98 |
| 3188692 | 8/1991 | Japan . | |
| 3-296288 | 12/1991 | Japan | 372/36 |
| 4-199890 | 7/1992 | Japan | 372/43 |

OTHER PUBLICATIONS

Wada et al. IEEE J. Lightwave Tech. vol. LT-7, p. 186, 1989 (No month available).

Wada, O. et al., IEEE Jou. Lightwave. Tech., vol.lt-7,pp. 186 1989(no month available).

*Primary Examiner*—Rodney B. Bovernick
*Assistant Examiner*—Yisun Song
*Attorney, Agent, or Firm*—Ratner & Prestia

[57] ABSTRACT

A semiconductor laser device comprising a first lead having a chip mounting part provided at the front end, at least one second lead separated from the first lead, a semiconductor laser element mounted on the chip mounting part, connecting means for electrically connecting the electrode of the semiconductor laser element and at least one second lead, and a frame body made of insulating material disposed so as to surround the semiconductor laser device and connecting means, and fixed to the first lead and second lead. In this semiconductor laser device, transparent resin is not used for sealing, and hence deterioration of light exit characteristic does not occur. Besides, because of the structure of fixing the leads to the frame body, it is rigid and excellent in reliability, and a multiplicity can be manufactured at once, so that it is easy to manufacture and is excellent in mass producibility.

33 Claims, 14 Drawing Sheets

SEMICONDUCTOR LASER DEVICE AND OPTICAL PICKUP HEAD

This application is a continuation of application Ser. No. 08/188,142 filed Jan. 27, 1994, now abandoned.

FIELD OF THE INVENTION

The present invention relates to a semiconductor laser device and optical pickup head used in the fields of optical information processing, optical measurement, optical communications, and the like.

BACKGROUND OF THE INVENTION

A conventional semiconductor laser device is described below.

FIG. 1 is an exploded perspective view of a typical conventional semiconductor laser device. This semiconductor laser device comprises a plate 9 mounting a semiconductor laser chip 1 mounted through a substrate 2 for heat sink, a photo detector 3 for monitoring laser beam, a metallic stem 4 mounting the plate 9 and photo detector 3, electrode terminals 7 mounted on the stem 4 through an insulating member 8, and a cap 5 possessing a window 6 attached to the stem 4 so as to accommodate the plate 9 and photo detector 3. Instead of putting on the metallic cap 5, there is also known a type of sealing the constituent members on the stem 4 with transparent resin.

However, the semiconductor laser device in such structure is great in the number of parts, and is hardly downsized. Still worse, it is necessary to assemble one by one individually, and the stem 4 must be handled carefully so that the constituent members on the stem 4 may not break down in the midst of assembling, and hence mass production is difficult. In addition, the number of parts is many, and the number of manufacturing steps is large, and the metallic stem is expensive, which results in a high manufacturing cost.

On the other hand, as a semiconductor device excellent in mass producibility, as shown in FIG. 2, a type of manufacturing by using a lead frame 10 is developed. In this semiconductor laser device, a semiconductor laser chip 14 is mounted on a chip mounting part 11 disposed at the front end of a middle lead 12a through a substrate 13 for heat sink, and the electrode of the semiconductor laser chip 14 and one of leads 12b, 12c at both sides are connected through a fine metallic wire 15, and these constituent members are sealed by transparent resin 16.

Such semiconductor laser devices can be manufactured by 10 to 20 pieces at once, and are hence superior in mass producibility. However, since the transparent resin 16 is directly contacting with the semiconductor laser chip 14, the following problems are brought about.

At the light emission point of the semiconductor laser chip 14, a radiant power output of more than several milliwatts is entrapped within a diameter range of 10 µm, and the light density is high and heat is generated. Accordingly, the transparent resin 16 is yellowed or deformed thermally. As a result of deterioration of the transparent resin 16, the optical output characteristic of the semiconductor laser device is lowered, and the long-term reliability is inferior.

The resin forming process in the manufacturing process of the semiconductor laser device is generally effected by pouring the transparent resin 16 at high temperature, and curing thermally or spontaneously. At this time, an internal stress is generated in the transparent resin 16, and the optical output characteristic of the semiconductor laser chip 14 is lowered, and, in an extreme case, the semiconductor laser chip 14 is broken.

As one of the measures for solving this problem, a structure has been proposed to coat the vicinity of the surface of the semiconductor laser chip with heat resistant and elastic resin, for example, silicon resin, and mold the transparent resin thereon. In this structure, however, the interface of the silicon resin and transparent resin is hardly smooth, and the wave front of the laser beam emitted from the semiconductor laser chip is likely to be disturbed.

A conventional optical pickup head using a semiconductor laser device is described below with reference to a schematic diagram in FIG. 3.

This optical pickup head comprises an objective lens 22 disposed so as to confront an optical disk 21, an actuator 23 for moving the objective lens 22, a reflector 24, a beam splitter 25, a grating 26 for generating three beams, a semiconductor laser device 27, and a photo detector 28. A laser beam 29 emitted from the semiconductor device 27 runs through a going passage shown in FIG. 3 and reaches the optical disk 21 to be reflected. At this time, the laser beam 29 is modulated by the optical disk 21 to become a signal light 30. This signal light 30 runs through the going passage shown in FIG. 3, and reaches the photo detector 28.

Such conventional optical pickup head is composed of individual parts including the objective lens 22, actuator 23, reflector 24, beam splitter 25, grating 25, semiconductor laser device 27, and photo detector 28. Therefore, the number of parts is larger and hence the number of manufacturing processes is many, and the assembling process is complicated because precise positioning among parts is necessary.

SUMMARY OF THE INVENTION

It is hence a primary object to present a semiconductor laser device and an optical pickup head excellent in long-term reliability, easy in assembling, and superior in mass producibility.

One preferred mode of a semiconductor laser device of the invention comprises a first lead having a chip mounting part disposed at the front end, at least one second lead separated from the first lead, a semiconductor laser element mounted on the chip mounting part, connecting means for electrically connecting the electrode of the semiconductor laser element and at least one second lead, and a frame body made of insulating material disposed so as to enclose the semiconductor laser element and connecting means, and fixed to the first lead and second lead.

This semiconductor laser device does not use transparent resin for sealing, and hence does not induce deterioration of optical output characteristic. Besides, the structure of fixing the leads to the frame body is superior in reliability. Since a multiplicity can be manufactured at a time, manufacturing is easy and mass producible.

In other preferred mode of the semiconductor laser device of the invention, a semiconductor laser element is formed on a semiconductor substrate, and on this semiconductor substrate, at least one signal processing circuit is formed, selected from the group consisting of a photo detecting circuit for detecting the light entering from outside, a laser beam detecting circuit for monitoring the power of the laser beam emitted from the semiconductor laser element, a current-voltage converting circuit for converting the signal current from at least one of the photo detecting circuit and laser beam detecting circuit into a signal voltage, an amplifying circuit for amplifying the signal voltage from the current-voltage converting circuit, an operational circuit for operating the signal voltage from at least one of the current-voltage converting circuit and the amplifying circuit, a DA converting circuit for converting the analog signal from the operational circuit to a digital signal, and a driving circuit for driving the semiconductor laser element.

In this way, by forming a signal processing circuit further on a semiconductor substrate on which the semiconductor laser element is formed, a semiconductor laser device of small size and high function is realized.

A preferred mode of an optical pickup head of the invention comprises a semiconductor laser device having a hologram optical element mounted on a frame body of the semiconductor laser device, focusing means for focusing the light beam emitted from the semiconductor laser device onto a recording medium, and control means for controlling the position of the focusing means.

This optical pickup head is composed of a small number of parts using the semiconductor laser device integrated with the hologram optical element for controlling the laser beam, so that reduction of size and curtailment of assembling cost can be realized.

BRIEF DESCRIPTION OF THE DRAWINGS

FIG. 11 (a) being a plan view, FIG. 11 (b) being a sectional view, and FIG. 11 (c) being a plan view in the midst of assembling.

DESCRIPTION OF THE PREFERRED EMBODIMENTS

EMBODIMENT 1

Figure 4A:
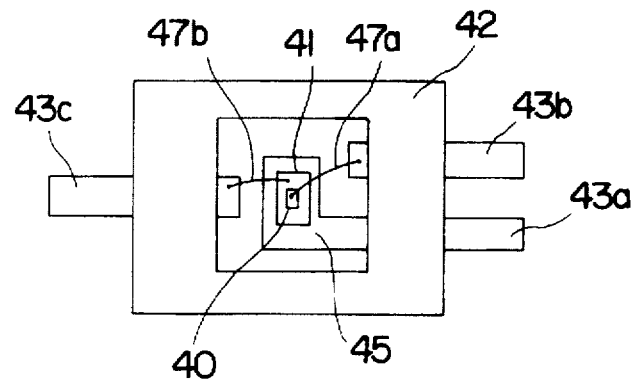
FIG. 4 (a), FIG. 4 (b), and FIG. 4 (c) are diagrams showing the structure of a semiconductor laser device using a frame body shown in Embodiment 1, FIG. 4 (a) being a plan view, FIG. 4 (b) being a sectional view, and FIG. 4 (c) being a plan view in the midst of assembling.
Figure 4B:
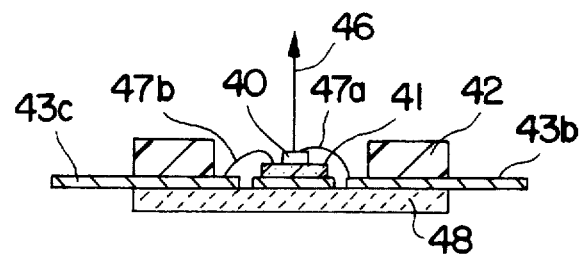
Figure 4C:
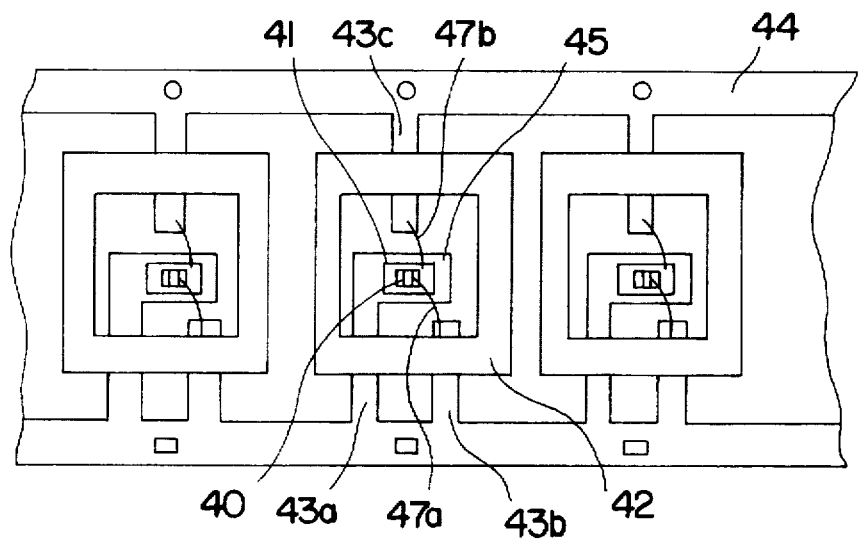

A semiconductor laser device shown in FIG. 4 (a) and FIG. 4 (b) comprises a semiconductor laser chip 40 of plane emission type, a silicon substrate 41 for heat sink mounting it, a resin-made frame body 42, an external lead 43a having a chip mounting part 45 at its front end, other external leads 43b, 43c, a metal fine wire 47a for connecting the electrode of the semiconductor laser chip 40 and the external lead 43b, a metal fine wire 47b for connecting the silicon substrate 41 and external lead 43c, and a protective plate 48. In this embodiment, the plane emission type is used as the semiconductor laser chip 40, but it is not limited to the semiconductor laser of plane emission type only as far as the laser exit beam 46 is emitted upward.

The semiconductor laser chip 40 is disposed on the silicon substrate 41 for heat sink, and the silicon substrate 41 for heat sink is disposed in the middle of the chip mounting part 45. The semiconductor laser chip 40 and metal fine wires 47a, 47b are enclosed by a frame body 42. The height of the frame body 42 is designed to be higher than the maximum point of the loop of the metal fine wires 47a, 47b as shown in FIG. 4 (b). In the lower part of the external leads 43a, 43b, 43c including the chip mounting part 45, moreover, the protective plate 48 is installed. As shown in FIG. 4 (c), in the manufacturing process, a lead frame 44 is used, and a plurality of semiconductor laser devices can be manufactured in batch.

In thus composed semiconductor laser device, all other directions than the passing direction of the laser exit beam 46 from the semiconductor laser chip 40 are protected by the frame body 42 and protective plate 48, so that the function as protective package is exhibited sufficiently. Still more, since the external leads 43a, 43b, 43c are fixed by the frame body 42 and protective plate 48, even after cutting out the individual semiconductor laser devices from the lead frame 44, the external leads 43a, 43b, 43c are not detached.

In the constitution of this embodiment, moreover, since the laser exit beam 46 does not pass through the transparent resin, characteristic changes of the laser exit beam 46 due to yellowing of transparent resin and the like do not occur.

In addition, since the semiconductor laser chip 40 does not directly contacts with the sealing resin, deterioration of the semiconductor laser chip 40 due to stress does not occur. In the embodiment, meanwhile, a resin is used as the material for the frame body 42, but as far as capable of keeping mutual insulation of the external leads 43a, 43b, 43c, ceramics, glass and other materials may be used, and the strength is further enhanced with ceramics.

EMBODIMENT 2

Figure 5:
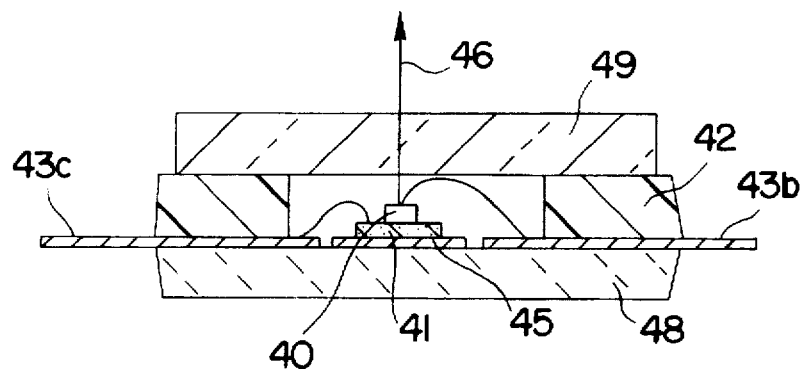
FIG. 5 is a sectional view of a semiconductor laser device having an optical flat plate mounted on a frame body shown in Embodiment 2.

FIG. 5 shows an optical flat plate 49 for passing the laser exit beam, being mounted on the foregoing semiconductor laser device. As shown in FIG. 5, an optical flat plate 49 made of glass, resin or the like for passing the laser exit beam 46 is disposed on the plane of the passing direction of the laser exit beam 46, while the protective plate 48 is disposed at the back side of the external leads 43a, 43b, 43c, so that the semiconductor laser chip 40 may be completely protected. Thus, the environmental resistance properties such as humidity resistance are enhanced.

EMBODIMENTS 3, 4

Figure 6:
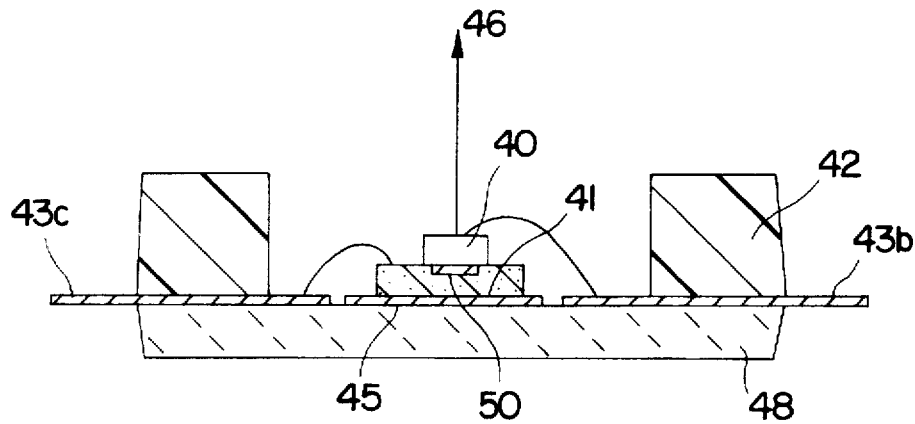
FIG. 6 is a sectional view of a semiconductor laser device forming a photo detector on a semiconductor substrate shown in Embodiment 3.
Figure 7:
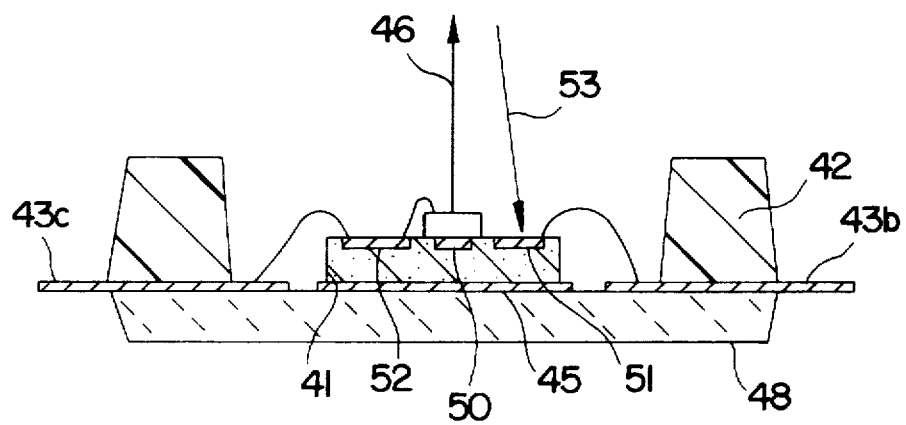
FIG. 7 is a sectional view of a semiconductor laser device forming a photo detecting circuit and a signal processing circuit further on a semiconductor substrate shown in Embodiment 4.

Explained next are examples of forming photo detector, signal processing circuit, and others on the silicon substrate 41 for heat sink on which the semiconductor laser chip 40 is mounted. In the semiconductor laser device shown in FIG. 6, a photo detector 50 for monitor for receiving the laser exit beam emitted from behind the semiconductor laser chip 40 is formed on the silicon substrate 41 for heat sink. In the semiconductor laser device shown in FIG. 7, a photo detecting circuit 51 for receiving signal light 53 from outside and a signal processing circuit 52 for processing the signal from the photo detecting circuit 51 are formed, aside from the photo detector 50 for monitor, on the silicon substrate 41 for heat sink.

The signal processing circuit may include, among others, a current-voltage converting circuit for converting the signal current from the photo detecting circuit and/or the laser beam detecting circuit into a signal voltage, an amplifying circuit for amplifying the signal voltage from the current-voltage converting circuit, an operational circuit for operating the signal voltage from the current-voltage converting circuit and/or the amplifying circuit, a DA converting circuit for converting the analog signal from the operational circuit to a digital signal, and a driving circuit for driving the semiconductor laser chip. Incidentally, some of these signal processing circuits may be formed on the silicon substrate 41 for heat sink, and the others on a different silicon substrate, or all circuits may be formed on the silicon substrate 41 for heat sink.

Figure 1:
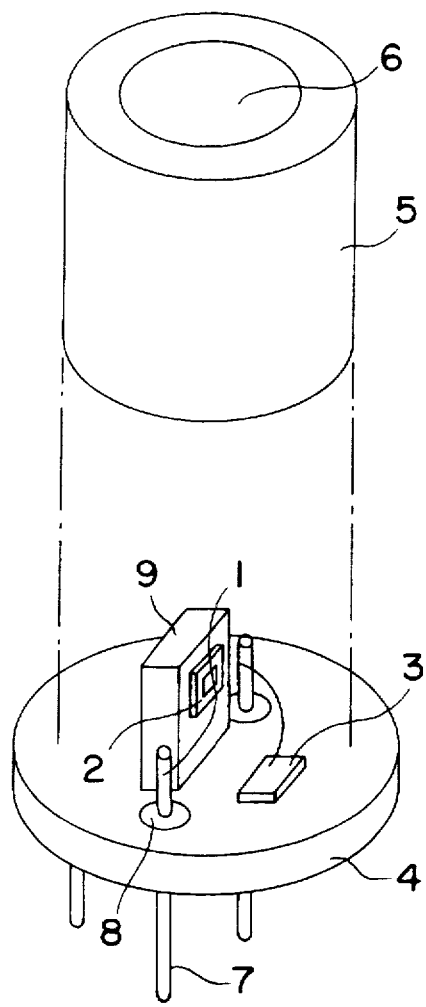
FIG. 1 is a perspective exploded view showing a conventional semiconductor laser device using a stem.
Figure 2:
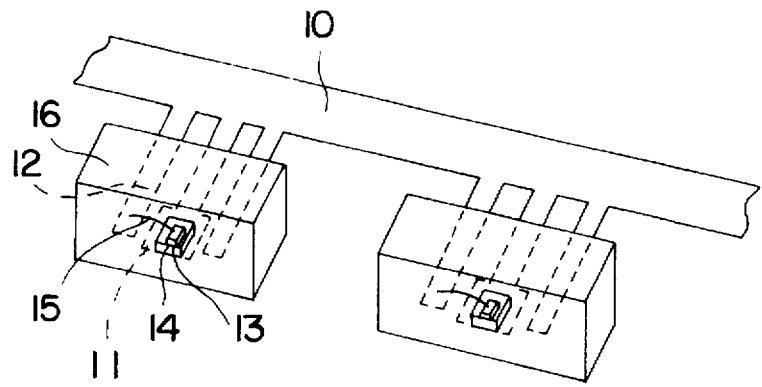
FIG. 2 is a perspective view showing a conventional semiconductor laser device sealed with resin.

The more circuits formed on the silicon substrate 41 for heat sink, the more increases the number of electrode terminals, and it was difficult to take out the electrode terminals to the outside in the conventional semiconductor laser device shown in FIG. 1. That is, as shown in FIG. 1, since the electrode terminals 7 are fixed to a stem 4 through an insulating material 8, it is difficult to dispose the electrode terminals 7 at short pitches, and it is hence hard to downsize the package. For example, in the stem 4 for the existing semiconductor laser device of 9 mm in diameter, the insulating material 8 occupies about 1 mm of the diameter, and therefore the electrodes can be disposed at least at intervals of 2 mm, and, to the contrary, if 20 electrode terminals are needed, the diameter of the stem 4 is required by 13 to 15 mm.

In this embodiment, on the other hand, since the lead frame can be used directly, the external leads 43 can be disposed at intervals of 0.3 to 0.4 mm, and when the electrode terminals are taken out from two confronting directions of a square package, a square package of 4 to 5 mm is realized, so that the size can be reduced substantially. Furthermore, in the conventional package shown in FIG. 1, the leading-out direction of the electrode terminals 7 is vertical to the plane of the stem 4, which occupies a large volume three-dimensionally.

By contrast, in the semiconductor laser device of the embodiment, all directions including the leading-out direction of the external leads 43a, 43b, 43c are composed in a flat plane, which is effective for thin package design. In the embodiment, the silicon substrate 41 is used as the substrate for heat sink, but the semiconductor laser chip 40 may be directly mounted on the chip mounting part 45 as far as heat is released sufficiently through the chip mounting part 45 and external lead 43a and the signal processing circuit is formed on other silicon substrate. The photo detector 50 for monitor and signal processing circuit 52 may be also formed on a different silicon substrate from the silicon substrate 41 for heat sink.

EMBODIMENT 5

Figure 8:
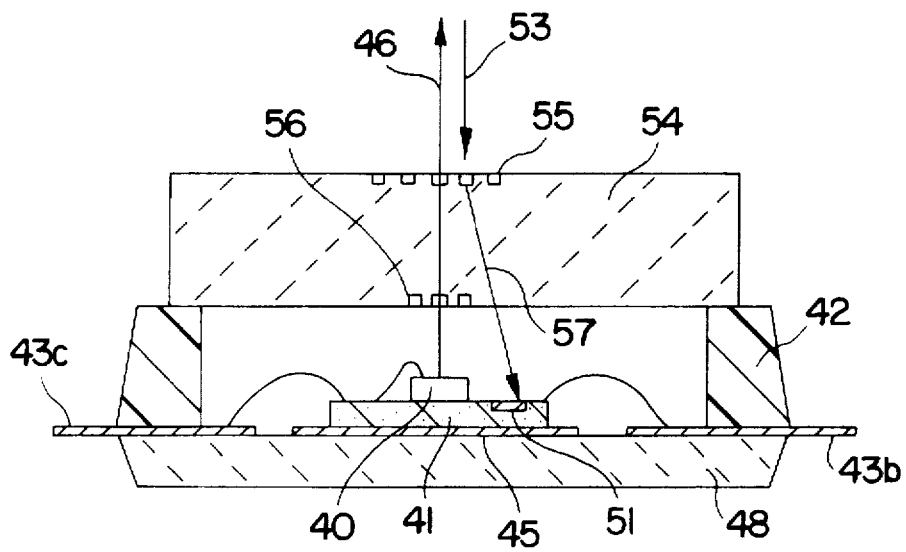
FIG. 8 is a sectional view of a semiconductor laser device mounting a hologram optical element on a frame body shown in Embodiment 5.

The semiconductor laser device shown in FIG. 8 is a modified example of Embodiment 2 (FIG. 5), in which, a hologram optical element 54 possessing a hologram pattern 55 for beam split and a grating pattern 56 for generating three beams is disposed instead of the optical flat plate 49. On the silicon substrate 41, a photo detecting circuit 51 for detecting diffracted light 57 diffracted by the hologram pattern 55 is formed.

By controlling the outgoing laser exit light 46 and incoming signal light 53 thus by the hologram optical element 54, a semiconductor laser device exhibiting an excellent performance when used in optical pickup head is realized. In case that a polarised hologram optical element is disposed instead of the hologram optical element 54, this semiconductor laser device is applied to a optical pickup head for an apparatus using an optomagnetic disk, since a polarized beam is separated within the semiconductor device.

EMBODIMENT 6

Figure 3:
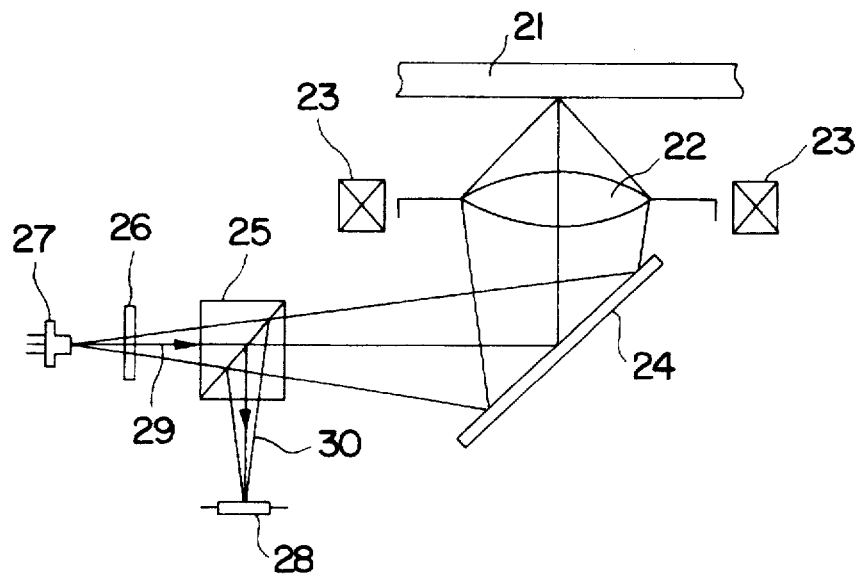
FIG. 3 is a schematic diagram showing the constitution of a conventional optical pickup head.
Figure 9:
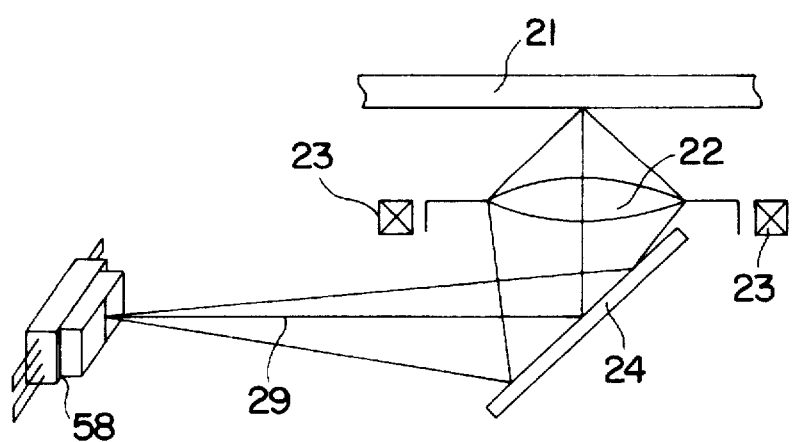
FIG. 9 is a schematic view showing the constitution of an optical pickup head for optical information recording apparatus shown in Embodiment 6.

An example of applying the semiconductor laser device 58 in Embodiment 5 in an optical pickup head is described while referring to FIG. 9. Meanwhile, same constituent members as those in the conventional optical pickup head shown in FIG. 3 are identified with same reference numerals. What differs the optical pickup head of the embodiment from the prior art shown in FIG. 3 is that a beam splitter 25, a grating 26 for generating three beams, a semiconductor laser device 27, and a photo detector 28 are integrated in the semiconductor laser device 58. In this way, the number of optical parts of the optical pickup head can be reduced to the semiconductor laser device 58, reflector 24, actuator 23, and objective lens 22, so that the pickup head may be reduced in size and thickness. Moreover, since positioning of optical parts has been already done in the semiconductor laser device 58, the allowable range of precision when assembling the semiconductor laser device 58 into the optical pickup head is greatly alleviated, and also the number of manufacturing processes is decreased, so that cost reduction may be realized.

In the conventional structure, a strict precision is required in assembling of optical parts, and it took lots of steps on the adjustment process, and also made it difficult to reduce the size of the entire optical pickup head.

EMBODIMENT 7

Figure 10:
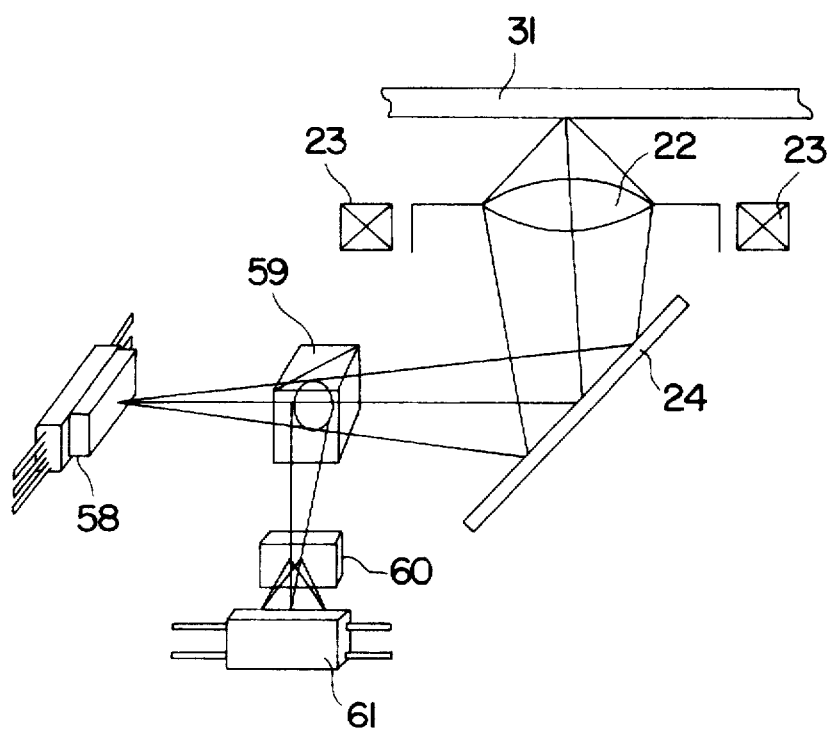
FIG. 10 is a schematic diagram showing the constitution of an optical pickup head for optomagnetic recording apparatus shown in Embodiment 7.

An example of applying the semiconductor laser device 58 in Embodiment 5 into the optical pickup head for an apparatus using an optomagnetic disk 31 is described with reference to FIG. 10. In this case, the semiconductor laser device 58, polarized beam splitter 59, polarized beam separating means 60 using Wollaston prism, diffraction element or the like, and photo detector 61 are used. The same reference numerals are given to the constituent elements same as those in the conventional optical pickup head shown in FIG. 3.

In thus constituted optical pickup head, the focus servo and tracking servo are controlled by using the error signal detected by the semiconductor laser device 58 and the photo detector 61.

In this optical pickup head, as the optical elements integrated in the semiconductor laser device 58, the hologram optical elements are used, but an optical pickup head of further excellent function may be realized by integrating the polarized beam splitter 59, polarized beam separating means 60 and others into the semiconductor laser device 58. Besides, by fabricating the height of the frame body 42 of the semiconductor laser device 58 at high precision, the precision in the heightwise direction is achieved only by putting other optical parts on the frame body 42, so that assembling of the optical pickup head and its adjustment may be extremely easy. Moreover, the shape and precision of the frame body 42 are determined by the die and resin material, but since the degree of freedom of the die design is high, it is easy to optimize the shape depending on the mating member for mounting the semiconductor laser device.

EMBODIMENT 8

Figure 11A:
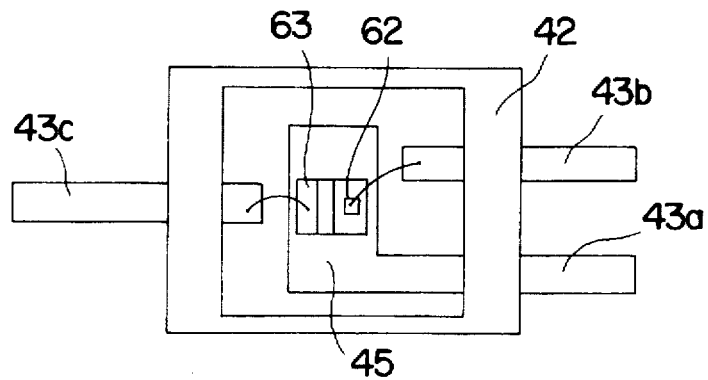
FIG. 11 (a), FIG. 11 (b), and FIG. 11 (c) are diagrams showing the constitution of a semiconductor laser device mounting a reflector on a semiconductor substrate shown in Embodiment 8.
Figure 11B:
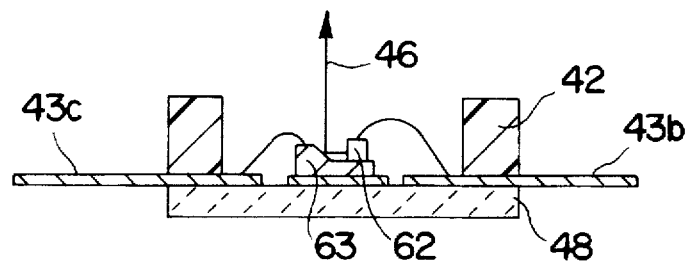
Figure 11C:
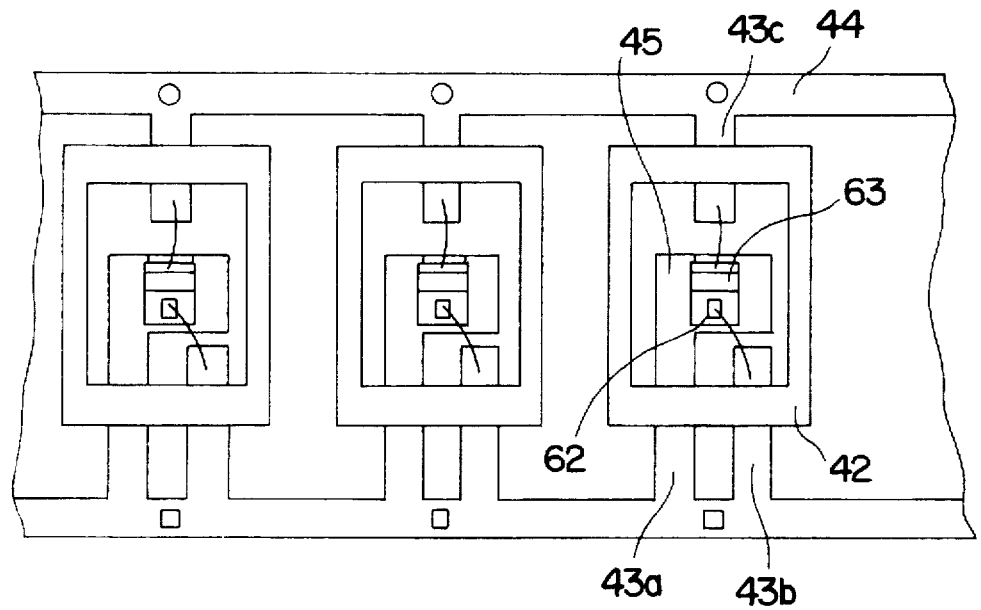

In a semiconductor laser device shown in FIG. 11 (a), FIG. 11 (b), and FIG. 11 (c), instead of the semiconductor laser chip 40 of plane emission type in Embodiment 1, a semiconductor laser chip 62 of end emission type is used, and a silicon substrate 63 for heat sink with 45-degree reflector is provided instead of the silicon substrate 41. Such silicon substrate 63 for heat sink is fabricated as follows. In the first place, the principal plane of the silicon substrate, which is a (100) plane possessing an off angle of 9 degrees from <110> direction, is anisotropically etched selectively, and a V-groove of which slope is a (111) plane is formed. The (111) plane has an angle of about 54 degrees to the (100) plane, and by using a 9-degree off-angle substrate, one of the (111) planes as side planes of the V-groove is about 45 degrees to the principal plane. Accordingly, by etching the side confronting the 45-degree plane of the V-groove to form a flat part for mounting the semiconductor chip 40, the silicon substrate 63 for heat sink with 45-degree reflector is obtained. The silicon substrate 63 for heat sink is mounted on the chip mounting part 45, and the semiconductor laser chip 62 is mounted thereon. Since the semiconductor laser chip 62 is of end emission type, the end plane for emitting the laser beam is mounted toward the 45-degree reflector. In such constitution, all other directions but the passing direction of the laser exit light 46 are protected by the frame body 42 and protective plate 48, so that the function as the protective package is sufficiently fulfilled. What is more, since the external leads 43a, 43b, 43c are fixed by the frame body 42 and protective plate 48, they are not detached even after the individual semiconductor laser devices are cut out from the lead frame 44 shown in FIG. 11 (c), and the package is stable. It is also possible to solve the conventional problem of change of characteristics of laser exit light due to yellowing of the transparent resin or the like by the laser exit light 46 passing through the transparent resin. Moreover, since the semiconductor laser chip 62 does not directly contact with the sealing resin, the problem of deterioration of the semiconductor laser chip 62 itself due to stress may be eliminated.

In the embodiment, the resin is used as the material for the frame body 42 in this embodiment, but glass material, ceramic material and others may be also used as far as the external leads 43 can be securely insulated, and the strength is further enhanced by the ceramic materials.

EMBODIMENT 9

Figure 12:
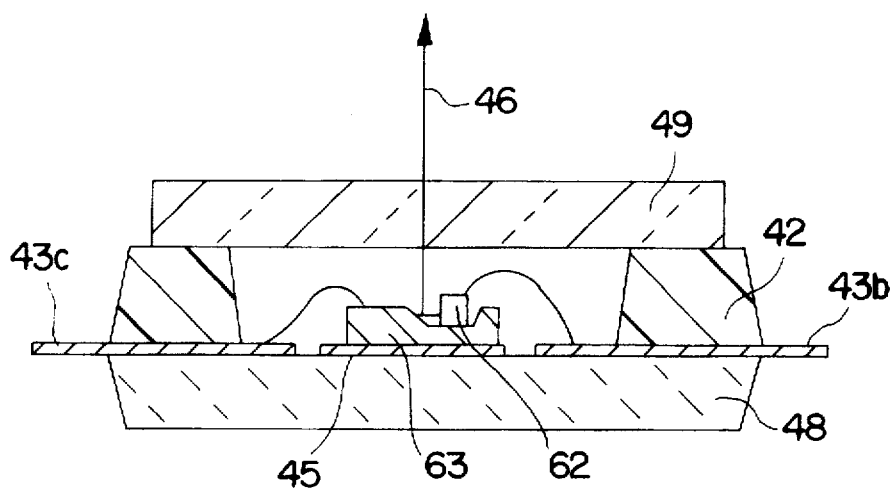
FIG. 12 is a sectional view of a semiconductor laser device mounting an optical flat plate on a frame body shown in Embodiment 9.

FIG. 12 shows an example of mounting an optical flat plate 49 on the frame body 42 in the semiconductor laser device in Embodiment 8. As shown in FIG. 12, by disposing the optical flat plate 49 made of glass, resin or the like for passing the laser exit light 46 on the plane of passing direction of the laser exit light 46, this direction is also protected, and the environmental resistance is enhanced.

EMBODIMENTS 10, 11

Figure 13:
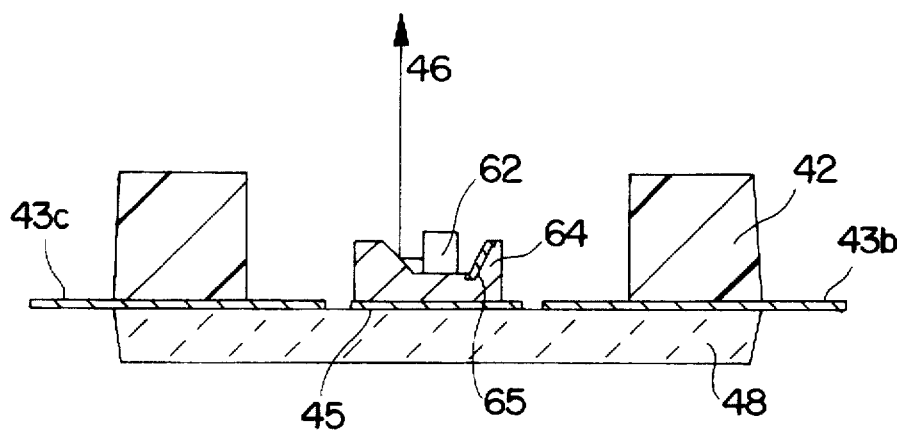
FIG. 13 is a sectional view of a semiconductor laser device forming a reflector and a photo detector on a semiconductor substrate shown in Embodiment 10.
Figure 14:
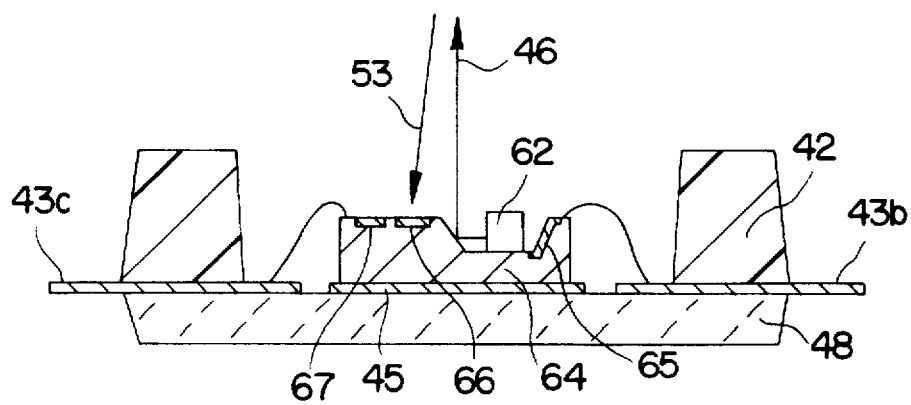
FIG. 14 is a sectional view of a semiconductor laser device forming a photo detecting circuit and a signal processing circuit further on a semiconductor substrate shown in Embodiment 11.

Embodiment 10 shown in FIG. 13 employs, instead of the silicon substrate 63 in Embodiment 8, a silicon substrate 64 for heat sink forming a photo detector 65 for monitor for detecting the laser beam emitted from behind the semiconductor laser chip 62. Embodiment 11 shown in FIG. 14 is to form a photo detecting circuit 66 and a signal processing circuit 67 on a silicon substrate 64. In the examples shown in FIGS. 13 and 14, meanwhile, the more the signal processing circuits are formed on the silicon substrate 64 for heat sink, the more the number of external leads increases, and it is impossible to handle with the structure of the prior art shown in FIG. 1. That is, in the stem 4 for the semiconductor laser device of 9 mm in diameter at the present, since the insulating material occupies about 1 mm, the electrodes are disposed only at intervals of 2 mm, and if 20 electrode terminals are required, on the other hand, the diameter of the stem 4 is required by 13 to 15 mm. In this embodiment, on the other hand, since the lead frame technology can be directly used, the external leads can be disposed at intervals of 0.3 to 0.4 mm, and when external leads are taken out from two confronting directions of the square package, the size can be extremely reduced in a package of 4 to 5 mm. Furthermore, in the conventional package shown in FIG. 1, the leading-out direction of the electrode terminals 7 is vertical to the surface of the stem 4, occupying a large volume three-dimensionally, while in the semiconductor laser device of the embodiment, all directions including the leading-out direction of the external leads are composed in a flat plane, so that it is effective also for a thin package size.

EMBODIMENT 12

Figure 15:
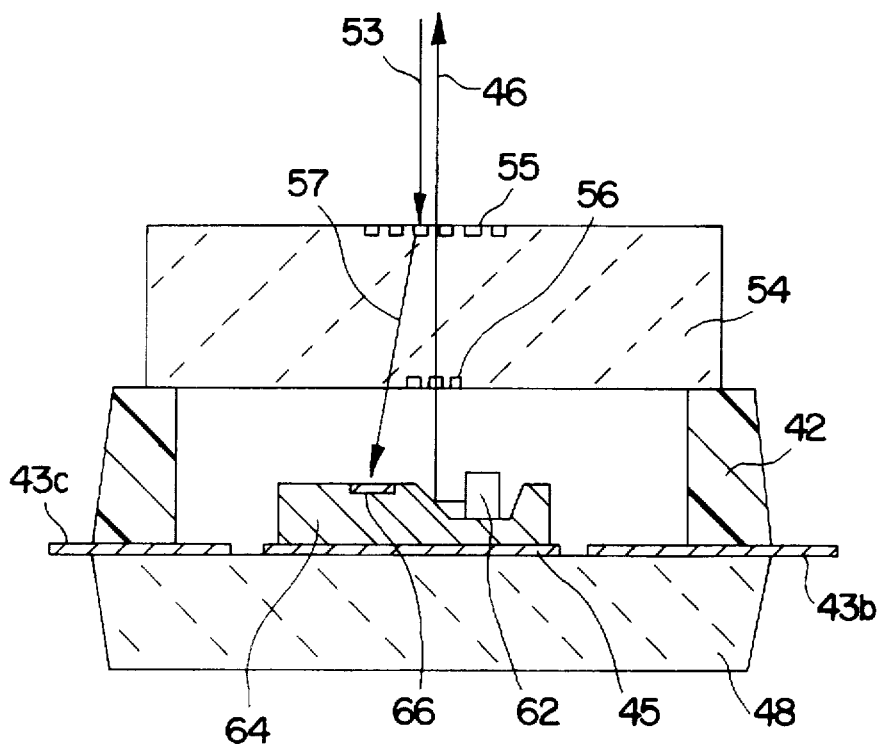
FIG. 15 is a sectional view of a semiconductor laser device mounting a hologram optical element on a frame body shown in Embodiment 12.

The embodiment shown in FIG. 15 is a modified example of Embodiment 5 (FIG. 8), and a semiconductor laser chip 62 of end emission type is used instead of the semiconductor laser chip 40 of plane emission type, and a silicon substrate 64 forming a photo detecting circuit 66 is used instead of the silicon substrate 41. In thus composed semiconductor laser device, by controlling the laser exit light 46 and signal light 53 by the hologram optical element 54, a semiconductor laser device exhibiting an excellent performance can be realized. By using such semiconductor laser device instead of the semiconductor laser device 58 in the optical pickup head shown in FIG. 9 or FIG. 10, an optical pickup head of smaller size and superior function is realized.

EMBODIMENT 13

Figure 16:
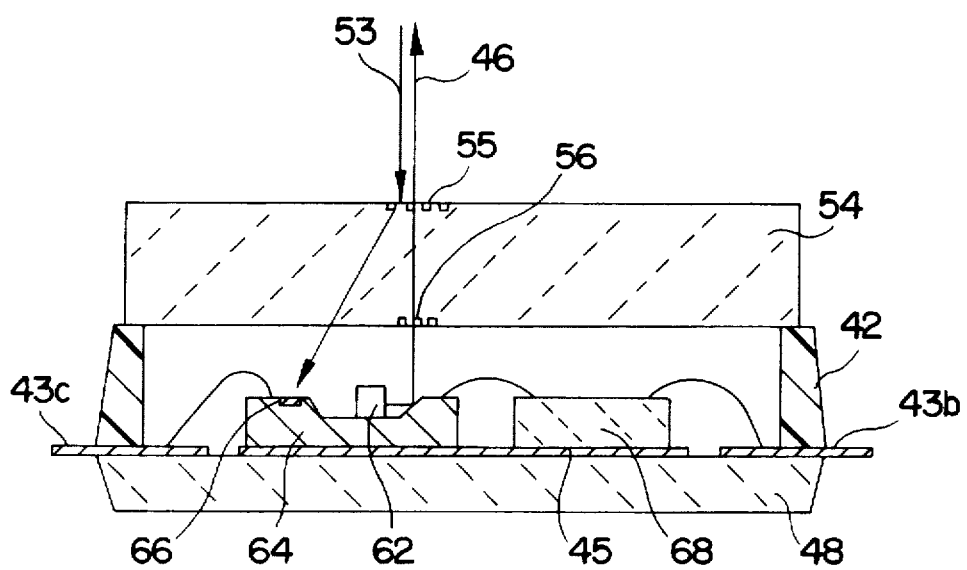
FIG. 16 is a sectional view of a semiconductor laser device disposing a first semiconductor substrate forming a semiconductor laser device and a photo detecting circuit, and a second semiconductor substrate forming a current-voltage converting circuit shown in Embodiment 13.

The embodiment shown in FIG. 16 is a modified example of Embodiment 12 (FIG. 15), and a silicon substrate 68 mounting a current-voltage converting circuit (not shown) is further provided. In addition, a current-voltage converting circuit for amplifying and converting the current signal from the photo detecting circuit 66 formed on the silicon substrate 64 into a voltage signal is formed on other silicon substrate 68, and the silicon substrate 68 and silicon substrate 64 for heat sink are mounted on a same lead 43a. When using the semiconductor laser device of the embodiment in the optical pickup head, noise is generated in the photo detection signal by the electromagnetic wave generated from the magnetic circuit of its actuator part. Therefore, by amplifying and converting the feeble current signal into a relatively large voltage signal, the S/N ratio of the signal is enhanced, and an optical pickup head of superior function is obtained.

In the embodiment, the photo detecting circuit 66 is formed on the silicon substrate 64 for heat sink, and the current-voltage converting circuit on the other silicon substrate 68, but all signal processing circuits including photo detecting circuit 66 may be also formed on the silicon substrate 68 forming the current-voltage converting circuit. Thus, by forming the amplifying circuit, operational circuit, DA converting circuit, laser driving circuit and others, aside from the current-voltage converting circuit, as the signal processing circuit, a more functionally excellent optical pickup head can be realized. In the embodiment, meanwhile, the semiconductor laser chip 62 of end emission type is mounted on the silicon substrate 64 for heat sink comprising a reflector, but the reflector is not needed by using the semiconductor laser chip of plane emission type capable of emitting laser beam directly upward.

EMBODIMENT 14

Figure 17:
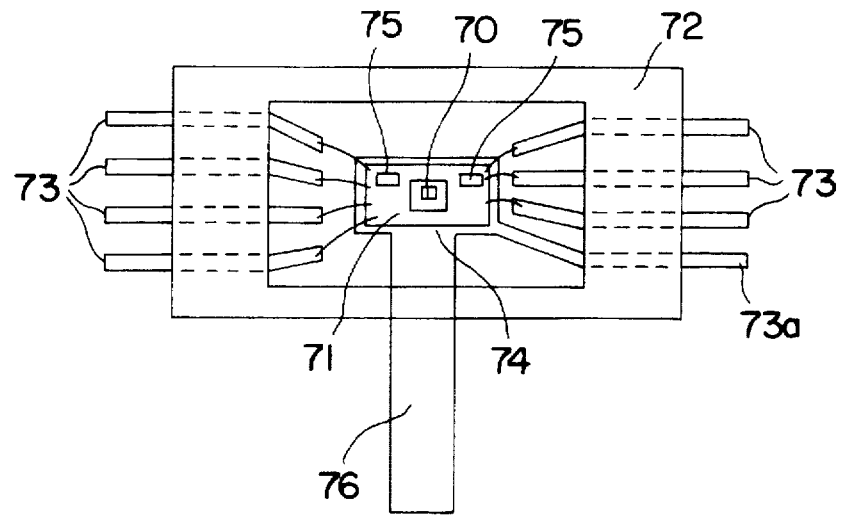
FIG. 17 is a plan view of a semiconductor laser device expanding the width of leads possessing a chip mounting part shown in Embodiment 14.

The semiconductor laser device shown in FIG. 17 comprises an external lead 73a possessing a chip mounting part 74 on the front end, other external lead group 73, a frame body 72 fixing these external leads 73a, 73, a silicon substrate 71 for heat sink mounted on the chip mounting part 74, a semiconductor laser chip 70 of plane emission type mounted on the silicon substrate 71, a signal processing circuit 75 formed on the silicon substrate 71, and a cooling plate 76 extended from the chip mounting part 74. The cooling plate 76 is extended in the direction at right angle to the leading-out direction of the external lead 73. The cooling plate 76 is disposed as the heat conducting route for release the heat generated in the semiconductor laser chip 70.

EMBODIMENT 15

Figure 18:
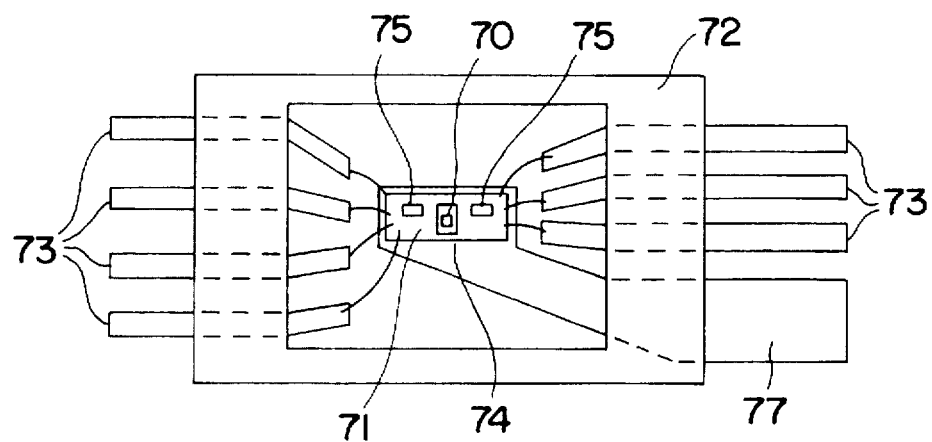
FIG. 18 is a plan view of a semiconductor laser device shown in Embodiment 15, being a modified example of Embodiment 14.

The semiconductor laser device shown in FIG. 18 shows a cooling plate serving also as external lead, instead of the cooling plate 76 shown in FIG. 17. The cooling plate 77 is broader in width than the external lead group 73, and is drawn out in the same direction as the external lead group 73.

EMBODIMENTS 16, 17

Figure 19:
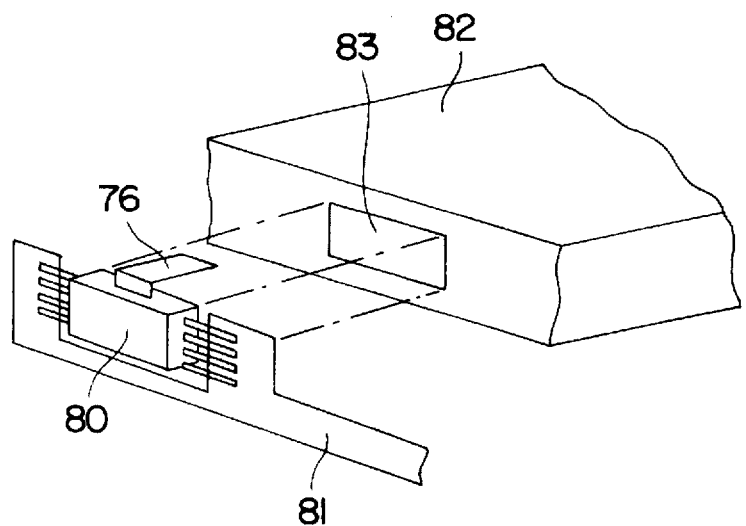
FIG. 19 is a perspective exploded view showing an optical pickup head assembling the semiconductor laser apparatus in Embodiment 14.
Figure 20:
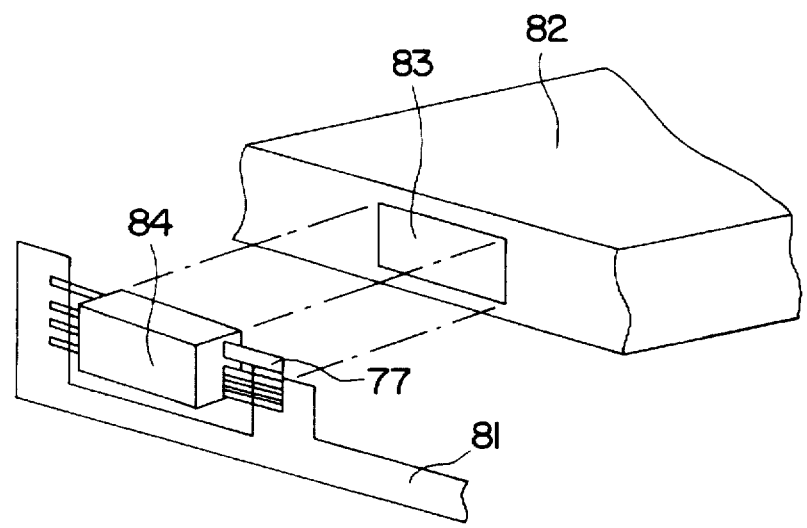
FIG. 20 is a perspective exploded view showing an optical pickup head assembling the semiconductor laser device of Embodiment 15.

FIG. 19 is a diagram showing the assembled state of the semiconductor laser device 80 in Embodiment 14 (FIG. 17) in the optical pickup head, and FIG. 20 is a diagram showing the assembled state of the semiconductor laser device 84 in Embodiment 15 (FIG. 18) in the optical pickup head. To assemble the optical pickup head, first, the semiconductor laser device 80 (84) is mounted on a circuit board 81. Next, the semiconductor laser device 80 (84) is matched with a window 83, and the circuit board 81 is mounted on the frame 82 of optical pickup head. At this time, the cooling plate 76 (77) is mounted on the frame 82 of large thermal capacity or other cooling means not shown in the drawing (for example, Peltier element, cooling fin), by screwing, soldering or high heat conductive adhesive, so that the heat from the semiconductor laser chip is released efficiently. By thus disposing the cooling plate 76 (77), the semiconductor laser chip may be maintained in a state close to room temperature, so that the reliability may be enhanced greatly.

For example, when the cooling plate 76 is not provided on the frame body 72 by using insulating resin, the thermal resistance is about 500 deg. C./W. That is, supposing the heat generation of the semiconductor laser chip 70 to be 0.1 W, the element temperature rises by about 50 deg. C., and when operated at room temperature of 25 deg. C., it means that the temperature of the semiconductor laser chip 70 may be 75 deg. C. Considering that the guaranteed temperature of the semiconductor laser chip 70 to be about 60 to 70 deg. C., it cannot be realized in this package.

On the other hand, using copper (0.2 mm thick) as the material, when the cooling plate 76 is composed in a length of 10 mm and width of 3 mm, the heat resistance is about 40 deg. C./W. This value is superior to about 60 deg. C./W of heat resistance of the semiconductor laser device of 5.6 mm in diameter shown in FIG. 1 used generally so far, and the package of excellent reliability can be realized. At this time, as the cooling terminals, terminals broader in width than the external lead group are used, but the same effect as the broad terminals may be substantially brought about by composing a plurality of terminals of same or smaller width.

EMBODIMENTS 18, 19

Figure 21:
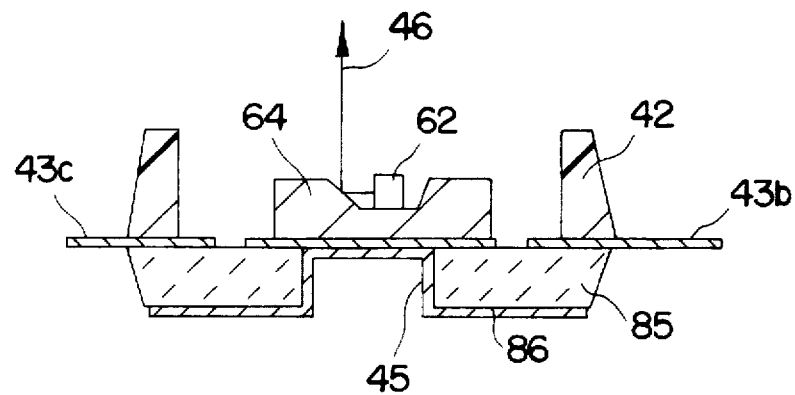
FIG. 21 is a plan view of a semiconductor laser device mounting a cooling plate on the back side of a chip mounting part of leads shown in Embodiment 18.
Figure 22:
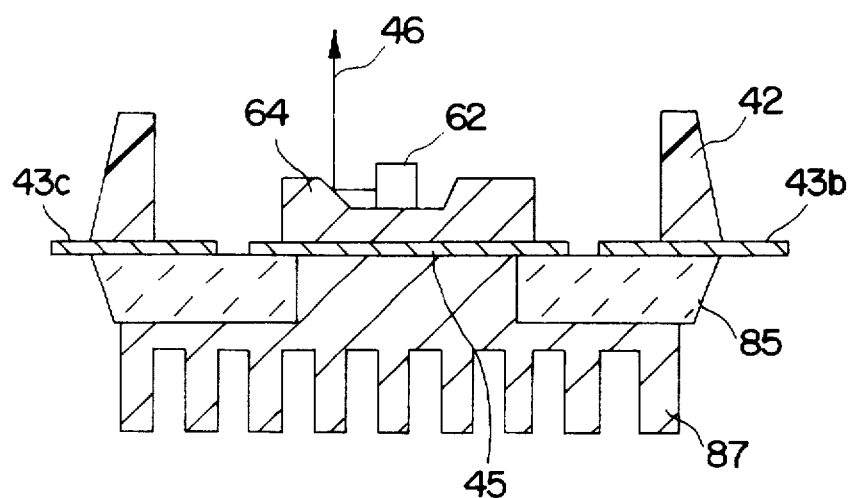
FIG. 22 is a plan view of a semiconductor laser device mounting cooling fins, instead of the cooling plate in FIG. 21, shown in Embodiment 19.

Embodiment 18 (FIG. 21) and Embodiment 19 (FIG. 22) relate to semiconductor laser devices similar to Embodiment 14 (FIG. 17) and Embodiment 15 (FIG. 18), respectively, except that the cooling means is different. The semiconductor laser chip 62 of end emission type is used, and the constitution is similar to Embodiment 10 (FIG. 13), except for the cooling means. In the case of Embodiment 18, using a protective plate 85 processed so that the back side of the chip mounting part 45 is exposed, a metal film 86 for cooling is formed including that portion.

In the case of Embodiment 19, a part of a cooling fin 87 is mounted in contact with the back side of the exposed chip mounting part 45, and the contact area with the air is increased to further enhance the cooling effect.

EMBODIMENT 20

Figure 23:
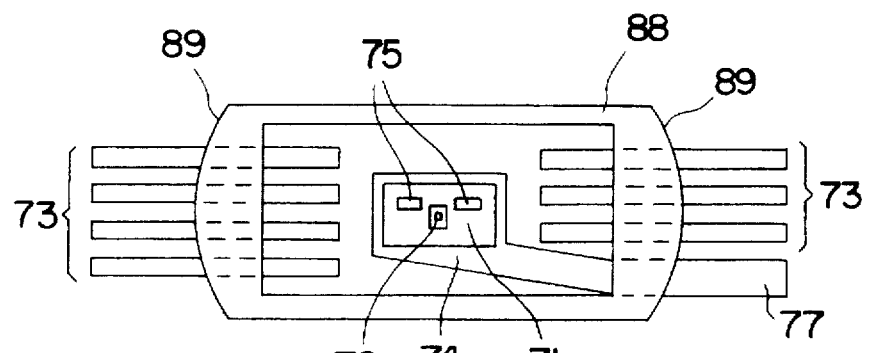
FIG. 23 is a plan view of a semiconductor laser device forming an arc in part of the outer circumference of a frame body shown in Embodiment 20.

The semiconductor laser device shown in FIG. 23 is a semiconductor laser device having the frame body 72 in Embodiment 15 in FIG. 18 replaced by a frame body 88 of which part of outer circumference is a cylindrical surface 89. However, the frame body 88 is formed by using a die so as to embed an external lead group 73 and a cooling plate 77.

To assemble the semiconductor laser device mounting the optical element 54 shown in FIG. 8 into an optical pickup head, it is often needed to adjust the rotation of the entire semiconductor laser device. When mounting as shown in FIG. 20, by using the outer circumference of the frame body 88 as the cylindrical surface 89 as shown in FIG. 23, and setting the window 83 of the frame 82 as an arc-shaped window of the same curvature as the cylindrical surface 89, the rotation may be easily adjusted after incorporating the semiconductor laser device into the arc-shaped window.

At this time, the cylindrical surface 89 of the frame body 88 is desired to be nearly on the center of the emission point of the semiconductor laser device.

EMBODIMENT 21

Figure 24A:
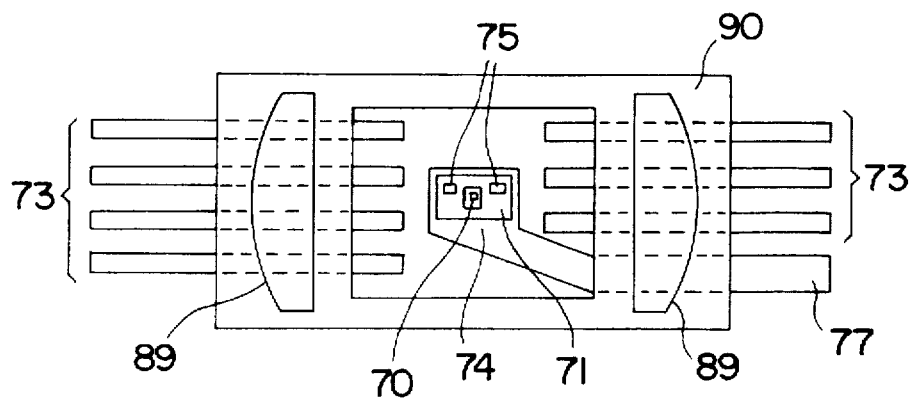
FIG. 24 (a) and FIG. 24 (b) are diagrams showing a semiconductor laser device having a step in the frame body, FIG. 24 (a) being a plan view and FIG. 24 (b) being a sectional view.
Figure 24B:
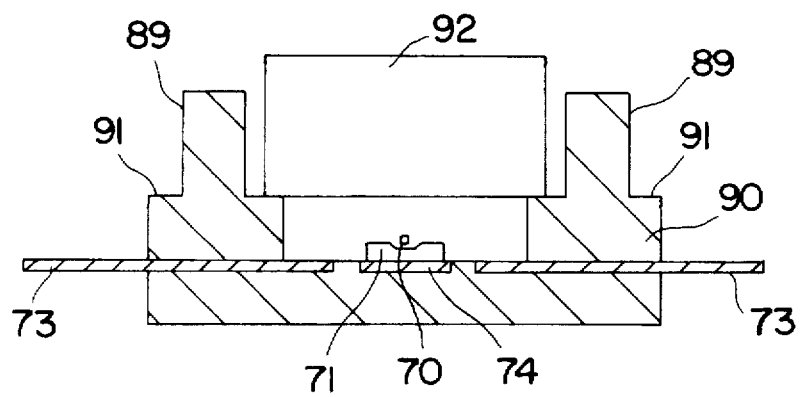

The semiconductor laser device shown in FIG. 24 (a) and FIG. 24 (b) employs a frame body 90 having a step 91, instead of the frame body 88 shown in FIG. 23. Same as in the case of Embodiment 20, by fitting into the arc-shaped window, it is easy to adjust the rotation of the semiconductor laser device itself, and moreover, when fitting into the window, the electrode does not hit against the window because of the step 91. It may be also used as the reference plane when mounting the semiconductor laser device. The optical element 92 can be disposed inside of the frame body 90, which is effective also from the viewpoint of protection and fixing of the optical element 92.

EMBODIMENT 22

Figure 25A:
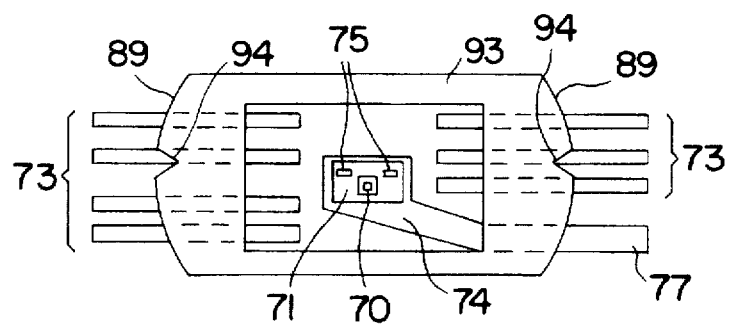
FIG. 25 (a) and FIG. 25 (b) are diagrams showing a semiconductor laser device having grooves for adjusting the position on the outer circumference of the frame body shown in Embodiment 22, FIG. 25 (a) being a plan view and FIG. 25 (b) being a sectional view.
Figure 25B:
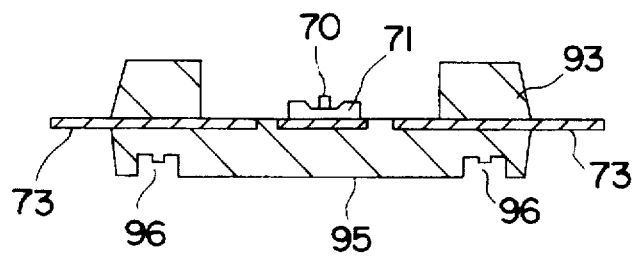

In the semiconductor laser device in FIG. 25 (a) and FIG. 25 (b), instead of the frame body 88 in Embodiment 20 shown in FIG. 23, a frame body 93 is used by forming a groove 94 for defining the position in the cylindrical surface 89 and a recess part 96 for defining the position in the bottom surface 95.

By thus disposing the groove 94 and recess part 96 in part of the frame body 93, position definition, position adjustment, and rotation adjustment may be done easily by the jig suited to the groove 94 and recess part 96 when mounting the semiconductor laser device. Incidentally it is not always necessary to dispose the groove 94 and recess part 96 at the same time, and either one may be enough or the groove 94 and recess part 96 may be replaced by protrusion or convex part.

EMBODIMENT 23

Figure 26A:
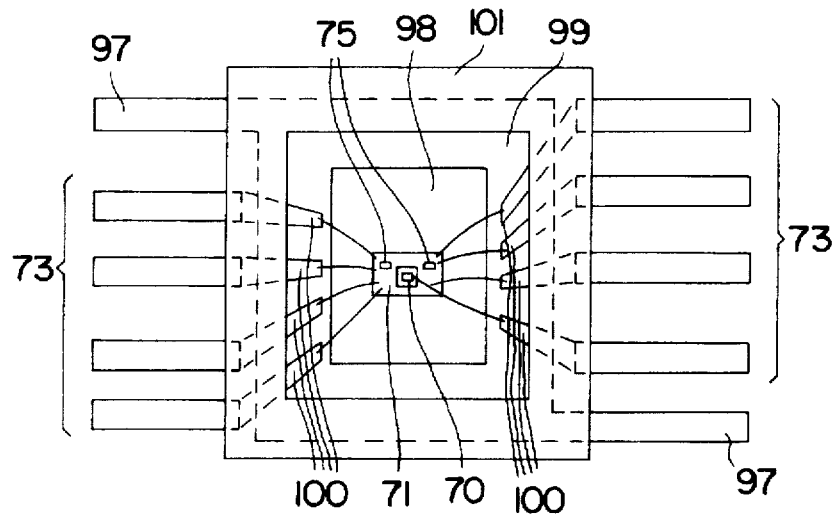
FIG. 26 (a) and FIG. 26 (b) are diagrams showing a semiconductor laser device forming an electrode pattern on a frame body shown in Embodiment 23, FIG. 26 (a) being a plan view and FIG. 26 (b) being a sectional view.
Figure 26B:
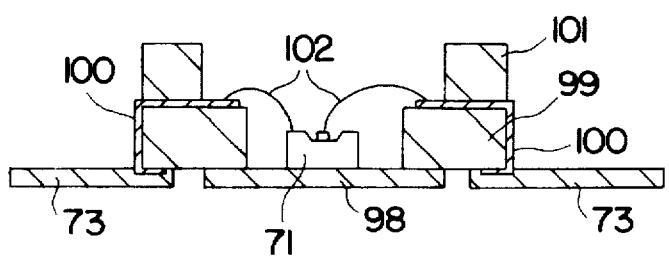

The semiconductor laser device shown in FIG. 26 (a) and FIG. 26 (b) is a modified example of Embodiment 15 shown in FIG. 18. In this case, at both sides of a chip mounting part 98, external leads 97 extended in the lead portion are used. On a first frame body 99 forming an electrode pattern 100 on the surface, a second frame body 101 is further disposed.

The electrode pattern 100, electrodes of the semiconductor laser chip 70, and electrodes on the silicon substrate 71 are connected with metal fine wires 102. The electrode pattern 100 is passed from the side of the first frame body 99 to the bottom, and is connected herein with the external lead group 73.

The lower side of the space enclosed by the first frame body 99 is kept airtight by the chip mounting part 98, so that airtightness may be maintained without resort to the protective plate.

The heat generated from the semiconductor laser chip 70 reaches up to the chip mounting part 98 of the external leads 97 made of metal, and is released therefrom. In this case, heat resistance elevation by protective heat does not occur, which is very effective from the viewpoint of heat radiation, too. In addition, since the semiconductor laser chip 70 and the electrodes on the silicon substrate 71 are connected to the external lead group 73 through the electrode pattern 100, it is easy to wire the semiconductor laser device to, for example, the flexible substrate.

The invention is not limited to the foregoing embodiments alone, and various modifications are possible. For example, in these embodiments, the semiconductor laser chip is mounted on the chip mounting part, but the semiconductor substrate forming the semiconductor laser element may be mounted on the chip mounting part together with the signal processing circuits.

Therefore, the modified examples existing within the spirit and scope of the invention are all included in the scope of the claims.

What is claimed is:

1. A semiconductor laser device comprising:
   a first lead having a chip mounting part provided at the front end,
   at least one second lead separated from the first lead,
   a semiconductor substrate for a heat sink mounted on the chip mounting part,
   a semiconductor laser element of plane emission type provided on a surface of the semiconductor substrate, wherein the semiconductor laser element is provided to emit a laser beam in a direction perpendicular to the surface of the semiconductor substrate,
   laser beam detecting means for monitoring power of a laser beam emitted from the semiconductor laser element, formed on the surface of the semiconductor substrate beneath the semiconductor laser element,
   connecting means for electrically connecting the electrode of the semiconductor laser element with the at least one second lead,
   a frame body made of an insulating material surrounding the semiconductor laser element and the connecting means, the frame body defining an open space through which a laser beam emitted from the semiconductor laser element passes in a direction perpendicular to the surface of the chip mounting part, the frame body comprising a lower part, a middle part, and an upper part, the first lead and the second lead being fixed to the lower part in parallel to the surface of the open space, a step being formed at the middle part, and a projection having a curved surface being disposed at the upper part, and
   photo detecting means for detecting light entering from outside said frame body, formed on the surface of the semiconductor substrate.

2. A semiconductor laser device of claim 1, wherein the semiconductor laser element of plane emission type is composed of a semiconductor laser chip of plane emission type mounted on the semiconductor substrate.

3. A semiconductor laser device of claim 2, wherein at least one circuit is formed on the surface of the semiconductor substrate, said at least one circuit selected from the group consisting of:
   (a) a current-voltage converting circuit for converting the signal current from at least one of (1) the photo detecting circuit and (2) the laser beam detecting element into a signal voltage,
   (b) the current-voltage converting circuit and an amplifying circuit for amplifying the signal voltage from the current-voltage converting circuit,
   (c) the current-voltage converting circuit, the amplifying circuit, and an operational circuit for operating the signal voltage from at least one of (1) the current-voltage converting circuit and (2) the amplifying circuit,
   (d) the operational circuit and a DA converting circuit for converting the analog signal from the operational circuit to a digital signal, and
   (e) a driving circuit for driving the semiconductor laser chip of plane emission type.

4. A semiconductor laser device of claim 3, wherein a window member composed of a material for passing the laser beam emitted from the semiconductor laser chip is disposed on the frame body.

5. A semiconductor laser device of claim 4, wherein the window member is composed of an optical element for converting the wave front of the laser beam.

6. A semiconductor laser device of claim 7, wherein, the optical element is a hologram optical element.

7. A semiconductor laser device of claim 6, wherein the hologram optical element is a polarized hologram optical element.

8. A semiconductor laser device of claim 1, wherein the semiconductor laser element of plane emission type is formed on the surface of the semiconductor substrate.

9. A semiconductor laser device of claim 8, wherein at least one circuit is formed on the surface of the semiconductor substrate, said at least one circuit selected from the group consisting of
   (a) a current-voltage converting circuit for converting the signal current from at least one of (1) the photo detecting circuit and (2) the laser beam detecting element into a signal voltage,
   (b) the current-voltage converting circuit and an amplifying circuit for amplifying the signal voltage from the current-voltage converting circuit,
   (c) the current-voltage converting circuit, the amplifying circuit, and an operational circuit for operating the signal voltage from at least one of (1) the current-voltage converting circuit and (2) the amplifying circuit,
   (d) the operational circuit and a DA converting circuit for converting the analog signal from the operational circuit to a digital signal, and
   (e) a driving circuit for driving the semiconductor laser element of plane emission type.

10. A semiconductor laser device of claim 9, wherein the semiconductor substrate is divided into a first semiconductor substrate possessing the semiconductor laser element of plane emission type, the laser beam detecting element and the photo detecting circuit, and a second semiconductor substrate possessing the at least one circuit.

11. A semiconductor laser device of claim 9, wherein a window member composed of a material for passing the laser beam emitted from the semiconductor laser element is disposed on the frame body.

12. A semiconductor laser device of claim 11, wherein the window member is composed of an optical element for converting the wave front of the laser beam.

13. A semiconductor laser device of claim 1,
   further comprising a cooling plate extended from the chip mounting part of the first lead, possessing a broader width than the width of the second lead.

14. A semiconductor laser device of claim 1,
   further comprising a cooling means to contact with the back side of the chip mounting part.

15. A semiconductor laser device of claim 1, wherein a convex part or concave part is provided on a bottom surface of the frame body.

16. A semiconductor laser device of claim 1,
   wherein the connecting means connects the electrode of the semiconductor laser element of plane emission type and the at least one second lead, through an electrode pattern reaching from an outside surface of the frame body to an inside surface thereof.

17. An optical pickup head comprising:
   a semiconductor laser device,
   focusing means for focusing the light beam emitted from the semiconductor laser device onto a recording medium, and
   control means for controlling the position of the focusing means,
   the semiconductor laser device comprises:
      a first lead having a chip mounting part provided at the front end,
      at least one second lead separated from the first lead,
      a semiconductor substrate for a heat sink mounted on the chip mounting part,
      a semiconductor laser chip of plane emission type mounted on a surface of the semiconductor substrate, wherein the semiconductor laser chip is mounted to emit a laser beam in a direction perpendicular to the surface of the semiconductor substrate,
      laser beam detecting means for monitoring power of a laser beam emitted from the semiconductor laser chip, formed on the surface of the semiconductor substrate beneath the semiconductor laser chip,
      connecting means for electrically connecting an electrode of the semiconductor laser chip with the at least one second lead,
      a frame body made of an insulating material surrounding the semiconductor laser chip and the connecting means, the frame body defining an open space through which the laser beam emitted from the semiconductor laser chip passes, the frame body comprising a lower part, a middle part, and an upper part, the first lead and the second lead being fixed to the lower part in parallel to the surface of the open space, a step being formed at the middle part, and a projection having a curved surface being disposed at the upper part,
      photo detecting means for detecting light entering from outside said frame body, formed on the surface of the semiconductor substrate,
      at least one circuit formed on the surface of the semiconductor substrate, the at least one circuit selected from the group consisting of:
         (a) a current-voltage converting circuit for converting the signal current from at least one of (1) the photo detecting circuit and (2) the laser beam detecting element into a signal voltage, (b) the current-voltage converting circuit and an amplifying circuit for amplifying the signal voltage from the current-voltage converting circuit, (c) the current-voltage converting circuit, the amplifying circuit, and an operational circuit for operating the signal voltage from at least one of (1) the current-voltage converting circuit and (2) the amplifying circuit, (d) the operational circuit and a DA converting circuit for converting the analog signal from the operational circuit to a digital signal, and (e) a driving circuit for driving the semiconductor laser chip, and an optical element disposed on the frame body, the optical element being composed of a material for passing the laser beam emitted from the semiconductor laser chip and converting the wave front of the laser beam.

18. An optical pickup head of claim 17, further comprising a polarized beam splitter disposed between the semiconductor laser device and the focusing means, and a photo detector for receiving the polarized beam from the polarized beam splitter.

19. An optical pickup head comprising:

a semiconductor laser device, focusing means for focusing the light beam emitted from the semiconductor laser device onto a recording medium, and control means for controlling the position of the focusing means, the semiconductor laser device comprises:

a first lead having a chip mounting part provided at the front end, at least one second lead separated from the first lead, a semiconductor substrate for a heat sink mounted on the chip mounting part, a semiconductor laser element of plane emission type formed on a surface of the semiconductor substrate, wherein the semiconductor laser element is formed to emit a laser beam in a direction perpendicular to the surface of the semiconductor substrate, laser beam detecting means for monitoring power of a laser beam emitted from the semiconductor laser element, formed beneath the semiconductor laser element, at least one circuit formed on the surface of the semiconductor substrate, the at least one circuit selected from the group consisting of:

(a) a current-voltage converting circuit for converting the signal current from at least one of (1) the photo detecting circuit and (2) the laser beam detecting element into a signal voltage, (b) the current-voltage converting circuit and an amplifying circuit for amplifying the signal voltage from the current-voltage converting circuit, (c) the current-voltage converting circuit, the amplifying circuit, and an operational circuit for operating the signal voltage from at least one of (1) the current-voltage converting circuit and (2) the amplifying circuit, (d) the operational circuit and a DA converting circuit for converting the analog signal from the operational circuit to a digital signal, and (e) a driving circuit for driving the semiconductor laser element, connecting means for electrically connecting an electrode of the semiconductor laser element with the at least one second lead, a frame body made of an insulating material surrounding the semiconductor substrate and the connecting means, the frame body defining an open space through which the laser beam emitted from the semiconductor laser element passes, the frame body comprising a lower part, a middle part, and an upper part, the first lead and the second lead being fixed to the lower part in parallel to the surface of the open space, a step being formed at the middle part, and a projection having a curved surface being disposed at the upper part, photo detecting means for detecting light entering from outside the frame body, formed on the surface of the semiconductor substrate at a vicinity of the semiconductor laser element, and an optical element disposed on the frame body, the optical element being composed of a material for passing the laser beam emitted from the semiconductor laser element and converting the wave front of the laser beam.

20. A semiconductor laser device comprising:

a first lead having a chip mounting part provided at the front end, at least one second lead separated from the first lead, at semiconductor substrate for heat sink mounted on the chip mounting part, the semiconductor substrate providing a first slant for reflecting a laser beam and a second slant confronting the first slant thereon, a semiconductor laser chip of end emission type mounted on the semiconductor substrate between the first slant and second slant, wherein the semiconductor laser chip is mounted to emit a laser beam towards the first slant in a direction parallel to a surface of the semiconductor substrate, laser beam detecting means for monitoring power of a laser beam emitted from the semiconductor laser chip, formed on the second slant, connecting means for electrically connecting an electrode of the semiconductor laser chip with the at least one second lead, a frame body made of an insulating material surrounding the semiconductor laser chip and the connecting means, the frame body defining an open space through which a laser beam reflected by the first slant passes in a direction perpendicular to the surface of the chip mounting part, the frame body comprising a lower part, a middle part, and an upper part, the first lead and the second lead being fixed to the lower part in parallel to the surface of the open space, a step being formed at the middle part, and a projection having a curved surface being disposed at the upper part, and photo detecting means for detecting light entering from outside the frame body, formed on the surface of the semiconductor substrate at an outside position of the first slant and second slant.

21. A semiconductor laser device of claim 20, wherein at least one circuit is formed on the semiconductor substrate, the at least one circuit selected from the group consisting of:

(a) a current-voltage converting circuit for converting the signal current from at least one of (1) the photo detecting circuit and (2) the laser beam detecting element into a signal voltage, (b) the current-voltage converting circuit and an amplifying circuit for amplifying the signal voltage from the current-voltage converting circuit, (c) the current-voltage converting circuit, the amplifying circuit, and an operational circuit for operating the signal voltage from at least one of (1) the current-voltage converting circuit and (2) the amplifying circuit, (d) the operational circuit and a DA converting circuit for converting the analog signal from the operational circuit to a digital signal, and (e) a driving circuit for driving the semiconductor laser chip of end emission type.

22. A semiconductor laser device of claim 21, wherein a window member composed of a material for passing the laser beam reflected by the first slant is disposed on the frame body.

23. A semiconductor laser device of claim 22, wherein the window member is composed of an optical element for converting the wave front of the laser beam.

24. A semiconductor laser device of claim 23, wherein the optical element is a hologram optical element.

25. A semiconductor laser device of claim 24, wherein the hologram optical element is a polarized hologram optical element.

26. A semiconductor laser device of claim 20, further comprising a cooling plate extended from the chip mounting part of the first lead, possessing a broader width than the width of the second lead.

27. A semiconductor laser device of claim 20, further comprising cooling means to contact with the back side of the chip mounting part.

28. A semiconductor laser device of claim 20, wherein a convex part or concave part is provided on a bottom surface of the frame body.

29. A semiconductor laser device of claim 20, wherein the connecting means connects an electrode of the semiconductor laser chip of end emission type and the at least one second lead, through an electrode pattern reaching from an outside surface of the frame body to an inside surface thereof.

30. An optical pickup head comprising:

a semiconductor laser device, focusing means for focusing the light beam emitted from the semiconductor laser device onto a recording medium, and control means for controlling the position of the focusing means, the semiconductor laser device comprises:

a first lead having a chip mounting part provided at the front end, at least one second lead separated from the first lead, a semiconductor substrate for a heat sink mounted on the chip mounting part, the semiconductor substrate providing a first slant for reflecting a laser beam and a second slant confronting the first slant thereon, a semiconductor laser chip of end emission type mounted on the semiconductor substrate, wherein the semiconductor laser chip is mounted to emit a laser beam towards the first slant in a direction parallel to a surface of the semiconductor substrate, laser beam detecting means for monitoring power of a laser beam emitted from the semiconductor laser chip, formed on the second slant, at least one circuit is formed on the semiconductor substrate, the at least one circuit selected from the group consisting of:

(a) a current-voltage converting circuit for converting the signal current from at least one of (1) the photo detecting circuit and (2) the laser beam detecting element into a signal voltage, (b) the current-voltage converting circuit and an amplifying circuit for amplifying the signal voltage from the current-voltage converting circuit, (c) the current-voltage converting circuit, the amplifying circuit, and an operational circuit for operating the signal voltage from at least one of (1) the current-voltage converting circuit and (2) the amplifying circuit, (d) the operational circuit and a DA converting circuit for converting the analog signal from the operational circuit to a digital signal, and (e) a driving circuit for driving the semiconductor laser chip of end emission type, connecting means for electrically connecting an electrode of the semiconductor laser chip with the at least one second lead, a frame body made of an insulating material surrounding the semiconductor laser chip and the connecting means, the frame body defining an open space through which a laser beam reflected by the first slant passes in a direction perpendicular to the surface of the chip mounting part, the frame body comprising a lower part, a middle part, and an upper part, the first lead and the second lead being fixed to the lower part in parallel to the surface of the open space, a step being formed at the middle part, and a projection having a curved surface being disposed at the upper part, an optical element disposed on the frame body, the optical element being composed of a material for passing the laser beam reflected by the first slant and converting the wave front of the laser beam, and photo detecting means for detecting light entering from outside the frame body, formed on the semiconductor substrate at an outside position of the first slant and second.

31. An optical pickup head of claim 30, further comprising a polarized beam splitter disposed between the semiconductor laser device and the focusing means, and a photo detector for receiving the polarized beam from the polarized beam splitter.

32. A semiconductor laser device of claim 1, wherein the projection comprises a pair of pillars, each of which includes a flat lateral surface and a partially cylindrical lateral surface.

33. A semiconductor laser device of claim 20, wherein the projection comprises a pair of pillars, each of which includes a flat lateral surface and a partially cylindrical lateral surface.

* * * * *

UNITED STATES PATENT AND TRADEMARK OFFICE
CERTIFICATE OF CORRECTION

PATENT NO. : 5,748,658
DATED : May 5, 1998
INVENTOR(S) : Nakanishi et al

It is certified that error appears in the above-identified patent and that said Letters Patent is hereby corrected as shown below:

On the cover page, item [56] Other Publications, delete the first entry "Wada et al. IEEE J. Lightwave Tech. Vol. LT-7, p. 186, 1989 (No month available)."

At column 13, claim 3, line 23, "chip" should read --element--.

Signed and Sealed this

Second Day of March, 1999

Attest:

Q. TODD DICKINSON

*Attesting Officer*  *Acting Commissioner of Patents and Trademarks*